United States Patent [19]

McGinn

[11] Patent Number: 4,794,348

[45] Date of Patent: Dec. 27, 1988

[54] LINEAR WIDEBAND DIFFERENTIAL AMPLIFIER AND METHOD FOR LINEARIZING THE SAME

[75] Inventor: Michael McGinn, Scottsdale, Ariz.

[73] Assignee: Motorola, Inc., Schaumburg, Ill.

[21] Appl. No.: 181,886

[22] Filed: Apr. 15, 1988

[51] Int. Cl.$^4$ .......................... H03F 1/32; H03F 3/45
[52] U.S. Cl. ..................................... 330/252; 330/149
[58] Field of Search .................. 330/149, 252; 358/184

[56] References Cited

U.S. PATENT DOCUMENTS 4,748,420  5/1988  Metz ..................................... 330/149

Primary Examiner—James B. Mullins
Attorney, Agent, or Firm—Michael D. Bingham

[57] ABSTRACT

A wideband linearized amplifier includes first and second differential amplifier sections each including differentially connected first and second pairs of transistors and a linearizing element coupled between the emitters of first ones of the second pair of transistors of each of the first and second differential amplifier sections which cancels the non-linear effects of the base-emitter junctions of the transistors of the amplifier. The bases of the first pair of transistors of the first and second differential amplifier sections are respectively coupled to differential inputs of the amplifier while the bases of the second pair of transistors of the first and second differential amplifier sections are coupled to a reference potential. The collectors of the first pair of transistors and the first transistor of the second pair of transistors of the first differential amplifier section and the collector of the second one of the second pair of transistors of the second differential amplifier section are coupled to a first output of the amplifier while the collectors of the first pair of transistors and the first one of the second pair of transistors of the second differential amplifier section and the collector of the second one of the second pair of transistors of the first differential amplifier section are coupled to a second output of the amplifier.

6 Claims, 1 Drawing Sheet

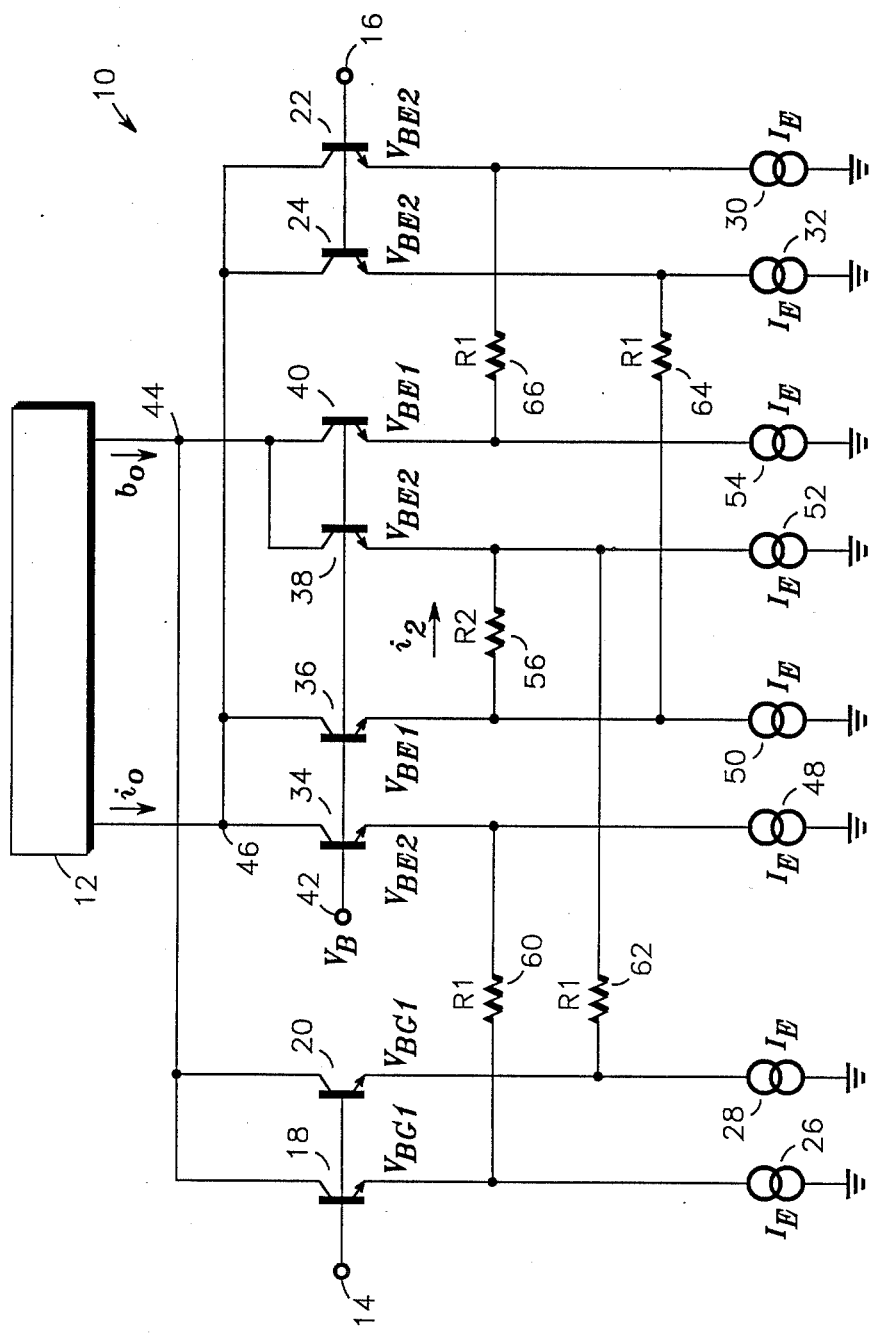

LINEAR WIDEBAND DIFFERENTIAL AMPLIFIER AND METHOD FOR LINEARIZING THE SAME

BACKGROUND OF THE INVENTION

The present invention relates to differential amplifiers and, more particularly, to a linearized wide band differential amplifier and method of eliminating distortion of the output current produced therefrom responsive to an applied differential input voltage.

There are many applications which require the use of differential amplifiers in which it is not desirable to introduce non-linearities in the output signal produced therefrom. One such application is in television receivers and, in particular, the differential IF input signal to the demodulator section of the TV demodulating system. Typically, a differential amplifier is used in the TV demodulating system as the interface between the IF output stage and the demodulator. In general the IF output signal is a differential voltage that is applied to the differential amplifier. The differential amplifier converts the voltage to a differential current that is supplied to the demodulator of the TV demodulating system. A problem associated with some prior art differential amplifiers is that distortion is introduced in the current outputs thereof due to the transistors base-emitter diode non-linearities. In monaural sound TV systems this may not be a problem. However, in high quality stereo TV systems this distortion can lead to beat notes which can lie close to the sound carrier signal. If the distortion is high enough, these beat notes can become audible which is highly undesirable.

In an attempt to eliminate this distortion, the prior art has included linearizing stages coupled to the input stage of the differential amplifier. Because the linearizing stage of the prior art has a frequency response different than the direct signal path phase errors are introduced. Hence, although the prior art linearizing scheme may work quite well at low frequencies, distortion generated in the differential amplifier will not be cancelled at high frequencies due to the phase shift in the cancelling current path of the linearizing stage with respect to the direct input signal path.

Thus, a need exists for a wideband linearizing scheme for eliminating distortion in a differential amplifier.

SUMMARY OF THE INVENTION

Accordingly, it is an object of the present invention to provide an improved differential amplifier.

It is another object of the invention to provide a linearized wide band differential amplifier.

Still another object of the invention is to provide a linearized wide band differential amplifier suitable for use in TV demodulating systems.

Yet another object of the invention is to provide a cancelling circuit and method for linearizing the output current of differential amplifier.

In accordance with the above and other objects there is provided a differential amplifier comprising first and second differential amplifier sections each including first and second differentially connected transistor pairs with the bases of the first pair of transistors of the first and second differential amplifier sections coupled respectively to first and second inputs of the amplifier while the bases of the second pair of transistors of the first and second differential amplifier sections are coupled to a terminal to which a reference potential is supplied, the collectors of the first pair of transistors of the first differential amplifier section are interconnected with the collectors of one of the transistors of the second pair of transistors of the first and second differential amplifier sections respectively to a first output of the amplifier while the collectors of the first pair of transistors of the second differential amplifier section are interconnected with the collectors of the other one of the transistors of the second pair of transistors of the first and second differential amplifier sections respectively to a second output of the amplifier; and a linearizing element coupled between the emitters of a respective transistor of the second pair of transistors of each of the first and second differential amplifier sections for providing a cancellation signal which cancels the non-linearity effects of the base-emitter diodes of the transistors of the amplifier.

BRIEF DESCRIPTION OF THE DRAWING

The single Figure is a schematic diagram illustrating the differential amplifier of the present invention.

DETAILED DESCRIPTION OF THE PREFERRED EMBODIMENT

Turning to the single Figure there is shown linearized differential amplifier 10 of the present invention. It is understood that amplifier 10 is suited to be manufactured in monolithic integrated circuit form utilizing convention bipolar processing techniques. A load means 12 is coupled to first and second outputs 44 and 46 at which are supplied antisecond phased output currents $i_o$ and $-i_o$ respectively. Differential amplifier 10 converts a differentially applied input voltage $V_i$ at inputs 14 and 16 to the differential output currents sourced at load means 12. A first differential amplifier section of amplifier 10 comprises first and second differentially connected pairs of transistors 18:20 and 34:38. Similarly, a second differential amplifier section is formed by first and second differentially connected pairs of transistors 22:24 and 36:40. The bases of transistors 18 and 20 are coupled to input 14 while the bases of transistors 22 and 24 are coupled to input 16. The bases of transistors 34, 36,38 and 40 are coupled to terminal 42 to which is supplied a reference voltage $V_B$. Transistors 18, 20, 38 and 40 have their collectors coupled to first output 44 while the collectors of transistors 22, 24, 34 and 36 are coupled to second output 46. The emitters of the transistors are respectively coupled to constant current sources 26, 28, 30, 32, 48, 50, 52 and 54 which source equal currents $I_E$. The emitter of transistor 18 is coupled to the emitter of transistor 34 via resistor 60 while the emitter of transistor 20 is coupled via resistor 62 to the emitter of transistor 38. Similarly, resistor 64 couples the emitter of transistor 24 to that of transistor 36 while resistor 66 couples the emitter of transistor 22 to the emitter of transistor 40. The operation of the differential amplifier sections is conventional as so far described in that a differential input voltage applied across inputs 14 and 16 causes transistors 18, 20, 36 and 40 to conduct while transistors 22, 24, 34 and 38 tend to be turned off and vice versa.

As will be described, non-linearity effects are created in the differential amplifier sections of amplifier 10 due to unequal changes in $V_{BE}$ (the voltage developed across the base-emitter diode of a transistor) of transistors 18 and 20 compared to transistors 34 and 38 in one section and transistors 22 and 24 compared to transistors 36 and 40 in the other section. For instance, as transistors 18 and 20 are turned on in response to a positive voltage $V_i$ at input 14 transistors 34 and 38 will be turned off. Similarly, transistors 36 and 40 will be turned on and transistors 22 and 24 will be turned off in response to the negative going voltage $V_i$ at input 16. In this state the $V_{BE}$ of transistors 18, 20, 36 and 40 will increase slightly while that of transistors 22, 24, 34 and 38 decreases greatly. Hence, the chnnge in the current $i_1$ flowing through transistors 18, 20, 36 and 40 is not linear with respect to the change in the current $-i_1$ flowing through transistors 22, 24, 34 and 38 with respect to the differential input voltage $V_i$ and $-V_i$. Thus, distortion is produced by the amplifier in converting the applied differential input voltage to a differential output current.

In the present invention the non-linear effects of the transistor base-emitter diodes in the differential amplifier sections is eliminated by use of a cancellation or linearizing circuit which, as illustrated, comprises resistor 56, that couples the emitter of transistor 36 to the emitter of transistor 38. The resistance of resistors 60, 62, 64 and 66 is equal to a value R1 while that of resistor 56 is equal to a value R2.

In describing how the non-linear effects of the base-emitter diodes of the differential amplifier sections are cancelled it will be assumed that a positive going input voltage is applied at input 14 with respect to input 16 and that a voltage $V_{BE1}$ is generated across the base-emitter of transistors 18 and 20 while a voltage $V_{BE2}$ is developed across the base-emitter of transistors 22 and 24. As transistors 18 and 20 are turned on the current $i_l$ flows through the resistors 60 and 62 and via the transistors 34 and 38 to terminal 42. This develops a bias voltage across the base-emitter of these transistors equal to $V_{BE2}$. Similarly, as transistors 22 and 24 turn off, the current $i_1$ flows from transistors 36 and 38 through resistors 64 and 66 as shown. Thus, $V_{BE1}$ is established across the base-emitter junction of these two transistors. The difference voltage between the emitters of transistors 36 and 38 establishes a current $i_2$ therethrough as well as resistor 56.

From the Figure is seen that the absolute magnitude of the anti-phase output currents produced at outputs 44 and 46 is equal to:

$$i_o = 3i_1 + i_2 - i_1; \text{ and} \tag{1}$$

$$i_o = 2i_1 + i_2 \tag{2}$$

Moreover, $$V_i = i_1 R1 + (V_{BE1} - V_{BE2}); \text{ or} \tag{3}$$

$$i_1 = \frac{V_i}{R1} - \frac{(V_{BE1} - V_{BE2})}{R1} \tag{4}$$

similarly, $$i_2 = \frac{(V_{BE1} - V_{BE2})}{R2} \tag{5}$$

Substituting equations 4 and 5 into equation 2 yields:

$$i_o = \frac{2V_i}{R1} - \frac{2(V_{BE1} - V_{BE2})}{R1} + \frac{(V_{BE1} - V_{BE2})}{R2} \tag{6}$$

If $R2 + R1/2$, then:

$$i_o = \frac{2V_i}{R1} \tag{7}$$

Thus, it is seen that the cancellation circuit of the present invention cancels the non-linear effects of the base-emitter diodes of the transistors of the input stage of differential amplifier 10 such that the output currents therefrom are a linear function of the differential applied input voltage $V_i$.

Hence, what has been described above is a novel differential amplifier the output of which is linear over a wideband of input signal frequencies. The amplifier includes first and second differential amplifier sections and a linearizing element the latter of which cancels the effect of diode non-linearities of the base-emitter junctions of the transistors comprising the differential amplifier.

What is claimed is:

1. An amplifier, comprising:
    a first differential amplifier section including first and second differentially connected transistor pairs, the bases of the first pair of transistors being coupled to a first input of the amplifier, the bases of the second pair of transistors being coupled to a terminal to which a reference potential is supplied, the collectors of the first pair of transistors and a first one of the second pair of transistors being coupled to a first output of the amplifier and the collector of the second one of the second pair of transistors being coupled to a second output of the amplifier;
    a second differential amplifier section including first and second differentially connected transistor pairs, the bases of the first pair of transistors being coupled to a second input of the amplifier, the bases of the second pair of transistors being coupled to said terminal, the collectors of the first pair of transistors and a first one of said second pair of transistors being coupled to said second output of the amplifier and the collector of the second one of said second pair of transistors being coupled to said first output of the amplifier; and
    circuit means coupled between the emitters of said first transistors of said second pair of transistors respectively of said first and second differential amplifier sections for providing a signal which cancels the non-linear effects of the base-emitter junctions of said taansistors of the amplifier.

2. The amplifier of claim 1 wherein said circuit means includes a resistor having a first resistance value.

3. The amplifier of claim 2 wherein said first differential amplifier section includes:
    a first resistor coupled between the emitters of the first one of said first pair of transistors and said second one of said second pair of transistors having a predetermined resistance value; and
    a second resistor coupled between the emitters of the second one of said first pair of transistors and the said first transistor of said second pair of transistors having said predetermined resistance value.

4. The amplifier of claim 3 wherein said second differential amplifier section includes:
    a first resistor coupled between the emitters one of said first pair of transistors and said second transistor of said second pair of transistors having said predetermined resistance value; and a second resistor coupled between the emitters of the second one of said first pair of transistors and said first transistor of said second pair of transistors having said predetermined resistance value.

5. The amplifier of claim 4 wherein said resistance value of said first and second resistors of said first and second differential amplifier sections is twice said resistance value of said resistor of said circuit means.

6. The amplifier of claim 5 including current supply means coupled to the emitters of said transistors of said first and second differential amplifier sections for sourcing a substantially constant current therethrough.

* * * * *

UNITED STATES PATENT AND TRADEMARK OFFICE
CERTIFICATE OF CORRECTION

PATENT NO. : 4,794,348

DATED : December 27, 1988

INVENTOR(S) : Michael McGinn

It is certified that error appears in the above-identified patent and that said Letters Patent is hereby corrected as shown below:

Column 4, claim 4, line 65, after "the emitters" insert --of the first--.

Signed and Sealed this

Second Day of January, 1990

Attest:

JEFFREY M. SAMUELS

Attesting Officer     Acting Commissioner of Patents and Trademarks